US012765414B2

(12) United States Patent
Hasnine et al.

(10) Patent No.: US 12,765,414 B2
(45) Date of Patent: Oct. 13, 2026

(54) SYSTEM IN A PACKAGE (SIP) WITH AIR CAVITY AND EPOXY SEAL

(71) Applicant: Qorvo US, Inc., Greensboro, NC (US)

(72) Inventors: MD Hasnine, Richardson, TX (US); Christine Blair, Lewisville, TX (US); Thomas Scott Morris, Lewisville, NC (US); Neftali Salazar, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 647 days.

(21) Appl. No.: 18/197,994

(22) Filed: May 16, 2023

(65) Prior Publication Data

US 2023/0402333 A1 Dec. 14, 2023

Related U.S. Application Data

(60) Provisional application No. 63/366,167, filed on Jun. 10, 2022.

(51) Int. Cl.
*H10W 76/15* (2026.01)
*H10W 72/00* (2026.01)
*H10W 74/01* (2026.01)

(52) U.S. Cl.
CPC ......... *H10W 76/15* (2026.01); *H10W 72/071* (2026.01); *H10W 74/014* (2026.01)

(58) Field of Classification Search
None
See application file for complete search history.

(56) References Cited

U.S. PATENT DOCUMENTS

| | | | | |
|---|---|---|---|---|
| 7,144,756 | B1 | 12/2006 | Wang et al. | |
| 7,187,077 | B1 * | 3/2007 | Nagarajan | H10W 76/60 257/730 |
| 9,899,292 | B2 | 2/2018 | Chiu et al. | |
| 10,115,677 | B2 | 10/2018 | Lee et al. | |
| 11,749,631 | B2 | 9/2023 | Chen et al. | |
| 2005/0077614 | A1 * | 4/2005 | Chengalva | H01L 23/42 257/E23.087 |
| 2007/0045812 | A1 | 3/2007 | Heng | |
| 2007/0108634 | A1 * | 5/2007 | Higashi | H01L 25/165 257/E23.137 |
| 2009/0283900 | A1 | 11/2009 | Yamada | |

(Continued)

FOREIGN PATENT DOCUMENTS

WO 2018169893 A1 9/2018

OTHER PUBLICATIONS

Non-Final Office Action for U.S. Appl. No. 17/657,185, mailed Jun. 18, 2024, 13 pages.

(Continued)

*Primary Examiner* — Jay C Chang
(74) *Attorney, Agent, or Firm* — Withrow & Terranova, P.L.L.C.

(57) ABSTRACT

A system in package (SiP) with an air cavity is disclosed. In one aspect, a technique to bond a lid over the air cavity that reduces the risk of cavity integrity failure is provided. More specifically, an epoxy seal is created on four walls of a lid enclosing the cavity. A further sputtered metal layer is added over the epoxy seal to provide additional structural rigidity, (Continued)

electromagnetic emission suppression and to assist in preventing leaks through the epoxy seal.

12 Claims, 6 Drawing Sheets

(56) References Cited

U.S. PATENT DOCUMENTS

| | | | | |
|---|---|---|---|---|
| 2010/0200983 | A1 | 8/2010 | Ono et al. | |
| 2012/0126347 | A1 | 5/2012 | Yang et al. | |
| 2015/0146399 | A1 | 5/2015 | Viswanathan et al. | |
| 2017/0263515 | A1* | 9/2017 | Bolognia | H01L 23/053 |
| 2018/0240757 | A1 | 8/2018 | Wong et al. | |
| 2018/0358298 | A1 | 12/2018 | Zhai et al. | |
| 2019/0311963 | A1* | 10/2019 | Christianson | H10W 70/65 |
| 2020/0008327 | A1 | 1/2020 | Lear et al. | |
| 2020/0304920 | A1* | 9/2020 | Achehboune | B81B 7/0058 |
| 2020/0312782 | A1 | 10/2020 | Eid et al. | |
| 2021/0050650 | A1 | 2/2021 | Chiu et al. | |
| 2022/0324231 | A1* | 10/2022 | Koike | B41J 2/161 |
| 2023/0063692 | A1 | 3/2023 | Wang et al. | |
| 2023/0145639 | A1 | 5/2023 | Hasnine et al. | |
| 2023/0178467 | A1 | 6/2023 | Meliane et al. | |
| 2023/0209789 | A1* | 6/2023 | Saito | H05K 1/0218 361/270 |
| 2023/0343721 | A1 | 10/2023 | Hasnine et al. | |

OTHER PUBLICATIONS

Final Office Action for U.S. Appl. No. 17/657,185, mailed Sep. 6, 2024, 17 pages.

Applicant-Initiated Interview Summary for U.S. Appl. No. 17/657,185, mailed Oct. 30, 2024, 4 pages.

Non-Final Office Action for U.S. Appl. No. 17/819,203, mailed Sep. 10, 2024, 14 pages.

Extended European Search Report for European Patent Application No. 22205106.2, mailed Jun. 29, 2023, 12 pages.

Galloway, J. et al., "Thermal performance of FCMBGA: Exposed molded die compared to lidded package," 2011 27th Annual IEEE Semiconductor Thermal Measurement and Management Symposium, Mar. 20-24, 2011, San Jose, CA, USA, IEEE, 6 pages.

Islam, N. et al., "Backside Metallization for Low Cost High Thermal Package," 2006 56th IEEE Electronic Components and Technology Conference (ECTC 2006), retrieved Jul. 12, 2022 from https://www.semiconductorpackagingnews.com/uploads/1/Backside_metalization_for_high_thermal_and_low_cost_package_IMAPS_DPC2020_extended_abstract.pdf, 4 pages.

Sure, G. et al., "Evaluation and Characterization of Molded flip-chip BGA Package for 28nm FPGA Applications," IPC APEX EXPO Conference Proceedings, Feb. 2012, retrieved Jul. 12, 2022 from http://www.circuitinsight.com/pdf/evaluation_characterization_molded_flip_chip_ipc.pdf, 9 pages.

* cited by examiner

SYSTEM IN A PACKAGE (SIP) WITH AIR CAVITY AND EPOXY SEAL

PRIORITY APPLICATION

The present application claims priority to U.S. Provisional Patent Application Ser. No. 63/366,167 filed on Jun. 10, 2022, and entitled, "SYSTEM IN A PACKAGE (SIP) WITH AIR CAVITY AND EPOXY SEAL," the contents of which are incorporated herein by reference in its entirety.

BACKGROUND

I. Field of the Disclosure

The technology of the disclosure relates generally to system in a package (SiP) assemblies that have air cavities.

II. Background

Computing devices abound in modern society, and more particularly, mobile communication devices have become increasingly common. Concurrent with the increase in availability of mobile communication devices has been an increase in the need to supply infrastructure for such mobile communication devices. Additionally, while mobile communication devices have seen explosive increases in the functionality available thereon, more traditional fixed computing devices have also seen increases in functionality. With the advent of the myriad functions available to such devices, there has been increased pressure to find ways to provide sufficient processing power in a single package. So-called system in a package (SiP) have evolved responsive to this pressure. However, SiP may be vulnerable to package failure, and this leaves room for innovation in this space.

SUMMARY

Aspects disclosed in the detailed description include a system in a package (SiP) with an air cavity and epoxy seal. In particular, a technique to bond a lid over the air cavity that reduces the risk of cavity integrity failure is provided. More specifically, an epoxy seal is created on four walls of a lid enclosing the cavity. A further sputtered metal layer is added over the epoxy seal to provide additional structural rigidity, electromagnetic emission suppression, and to assist in preventing leaks through the epoxy seal.

In this regard in one aspect, a SiP is disclosed. The SiP comprises a substrate comprising an upper surface. The SiP also comprises a lid having a lower lip surface coupled to the upper surface with a first epoxy, the lid further having exterior walls. The SiP also comprises a second epoxy coupled to the first epoxy and covering the exterior walls of the lid.

In another aspect, a method of forming a SiP is disclosed. The method comprises securing a plurality of lids to a substrate with a first epoxy. The method also comprises filling space between the plurality of lids with a second epoxy coating sidewalls of the plurality of lids. The method also comprises singulating packages by cutting through the second epoxy coating the sidewalls.

DETAILED DESCRIPTION

Figure 1A:
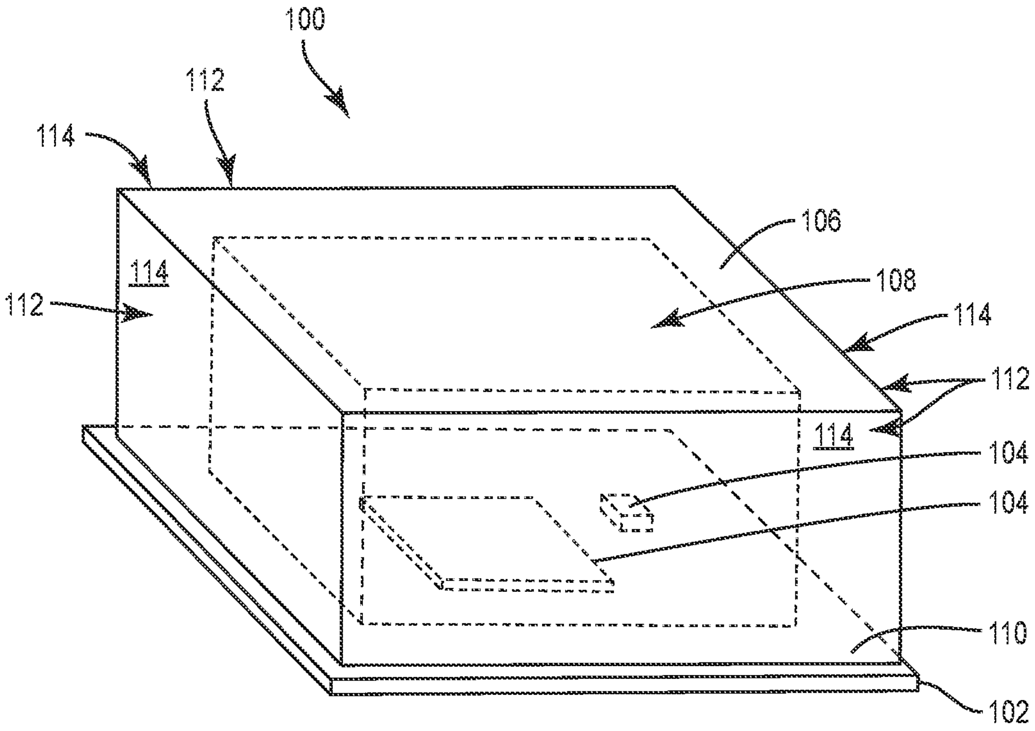
FIG. 1A is a perspective stylized side elevational view of a system in a package (SiP) according to an exemplary aspect of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a system in a package (SiP) with an air cavity and epoxy seal. In particular, a technique to bond a lid over the air cavity that reduces the risk of cavity integrity failure is provided. More specifically, an epoxy seal is created on four walls of a lid enclosing the cavity. A further sputtered metal layer is added over the epoxy seal to provide additional structural rigidity, electromagnetic emission suppression, and to assist in preventing leaks through the epoxy seal.

Historically, multiple chips or integrated circuit (IC) dies may be placed on a single substrate and covered with a lid or overmold material, which is typically a plastic material. The lid is bonded to the substrate leaving an air cavity over the chips on the substrate. The lid may have a different coefficient of thermal expansion (CTE) than the substrate and/or the material used to bond the lid to the substrate. The different CTE may cause the materials to expand and contract at different rates during thermal cycling. Such differences place stress on the bond and may result in failure at the bond. In the context of a near-hermetic SiP, such failure may be referred to as gross leak failure. Such a failure may allow moisture to enter the air cavity of the SiP. The presence of moisture may, for moisture-sensitive circuitry and components (i.e., nearly all circuits), cause corrosion or otherwise degrade performance. Accordingly, such failures are undesirable, and, when detected during manufacturing, require manual correction, which is slow and adds expense to the component. Accordingly, there is a desire to provide a better bond to prevent such gross package failures.

Exemplary aspects of the present disclosure provide a technique to provide a better bond between a lid and a substrate that reduces the likelihood of gross package failure. In particular, a lid is initially bonded to a top surface of a substrate through a lid seal epoxy material. An additional epoxy material is applied around the lid and on exposed portions of the substrate. Where multiple packages are being formed concurrently, a singulation step may be used to separate packages from one another. Optionally, a metal layer may be sputtered over the sides and top of the lid to provide additional rigidity and electromagnetic shielding if desired.

In this regard, FIG. 1A is a side perspective view of a SiP 100 having a substrate 102 with chips (or chiplets) and components 104 mounted thereon. The substrate 102 may be a laminated FR4 material, glass-epoxy system, polyimide, polytetrafluoroethylene (PTFE), ceramic, dielectric material, a luminant, or the like and may include interior metal layers, and as such, the substrate 102 may also be referred to as a metallization structure. A lid 106 is securely attached or affixed to the substrate 102 to create an air cavity 108. The lid 106 may also be made from an FR4 material or the like. More particularly, the lid 106 is affixed to the substrate 102 with a lid seal epoxy 110. An additional epoxy 112 may coat the exterior four sidewalls 114 of the lid 106. The additional epoxy 112 may bond with the lid seal epoxy 110. The additional epoxy 112 may be a standard encapsulant or epoxy.

Figure 1B:
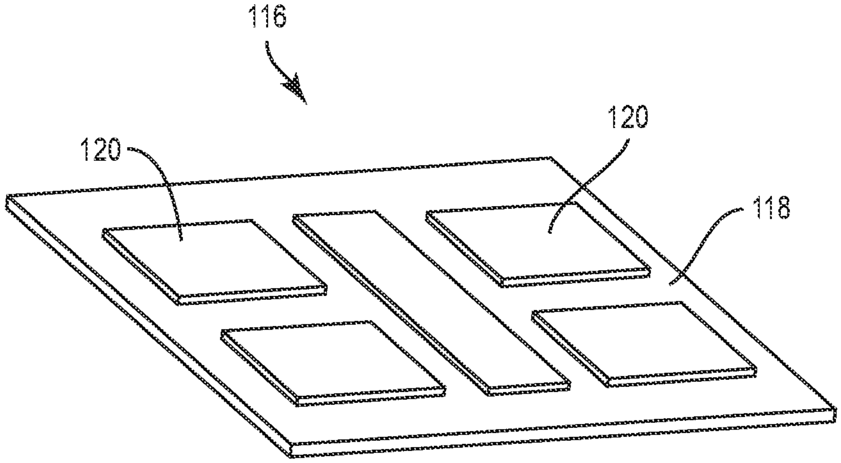
FIG. 1B is a perspective view of a substrate having a plurality of components thereon prior to placing a lid over the components.

The chips and components 104 may include various die material(s) such as silicon (Si), gallium arsenide (GaAs), gallium nitride (GaN), silicon germanium (SiGe), indium phosphide (InP), or other material(s). In most aspects, the chips and components 104 may be flip chip or wire bonded dies, but may also include surface mounted components (SMD) or the like. In some aspects, the chips and components 104 may include one or more 'chiplets' 116 as better shown in FIG. 1B. A chiplet 116 may comprise a substrate interposer 118 interconnecting one or more dies 120 thereupon. The substrate interposer 118 in some configurations may include semiconducting materials such as Si, silicon carbide (SiC), GaN, and GaAs. The substrate interposer 118 may also comprise a sandwiched network of interconnecting layer(s) deposed between low-k dielectric materials such as Ajinomoto Build-up Film (ABF), glass, or other suitable materials.

Figure 2:
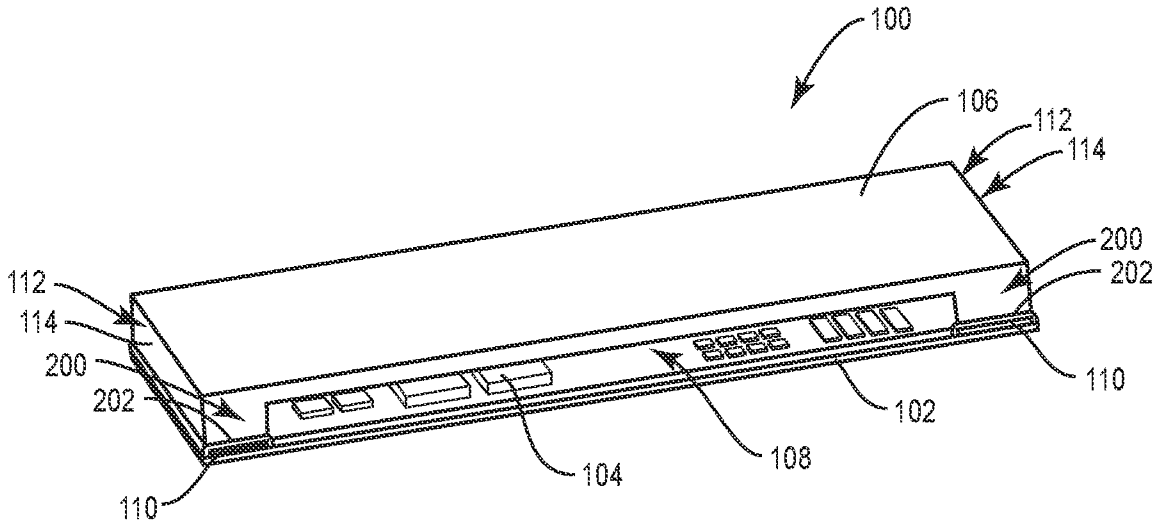
FIG. 2 is a perspective cross-sectional elevational view of the SiP of FIG. 1A or 1B.

FIG. 2 provides a cross-sectional view of the SiP 100 of FIG. 1A and particularly illustrates the downwardly-directed lip portions 200 of the lid 106. The lip portions 200 have a lower surface 202. The lower surface 202 of the lip portion 200 couples to the substrate 102 using the lid seal epoxy 110. The additional epoxy 112 coats the sidewalls 114 of the lid 106 (i.e., the outwardly facing part of the lip portions 200).

Figure 3:
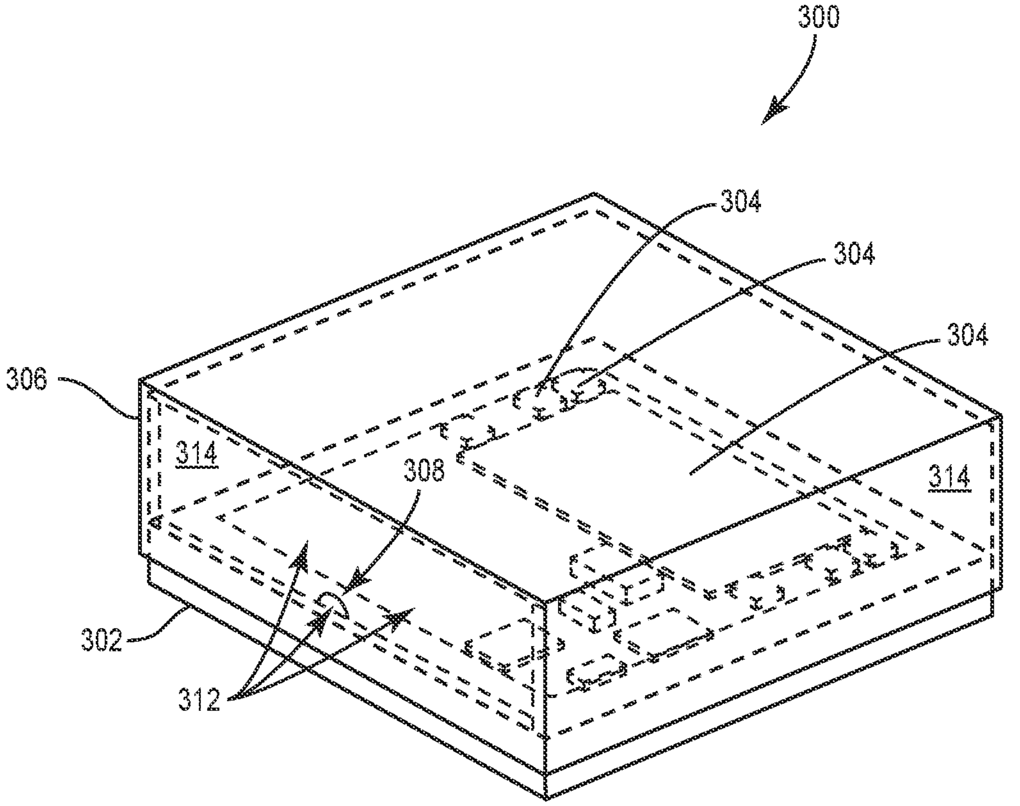
FIG. 3 is a perspective side elevational view of a SiP with a side vent aperture visible.

FIG. 3 illustrates an alternate SiP 300. The SiP 300 includes a substrate 302 with components 304 thereon (but analogous to the chips and components 104 of FIG. 1A). The SiP 300 may further include a lid 306 that delimits an additional aperture 308 that may be used initially to vent the interior air cavity (not shown in FIG. 3). During assembly, the aperture 308 allows heated (and thus expanded) gas to escape from the interior air cavity. When an additional epoxy 312 is applied to sidewalls 314, the aperture 308 is sealed by the additional epoxy 312. Such venting may prevent an overpressure condition that would stress epoxy bonds of the SiP 300.

Figure 4:
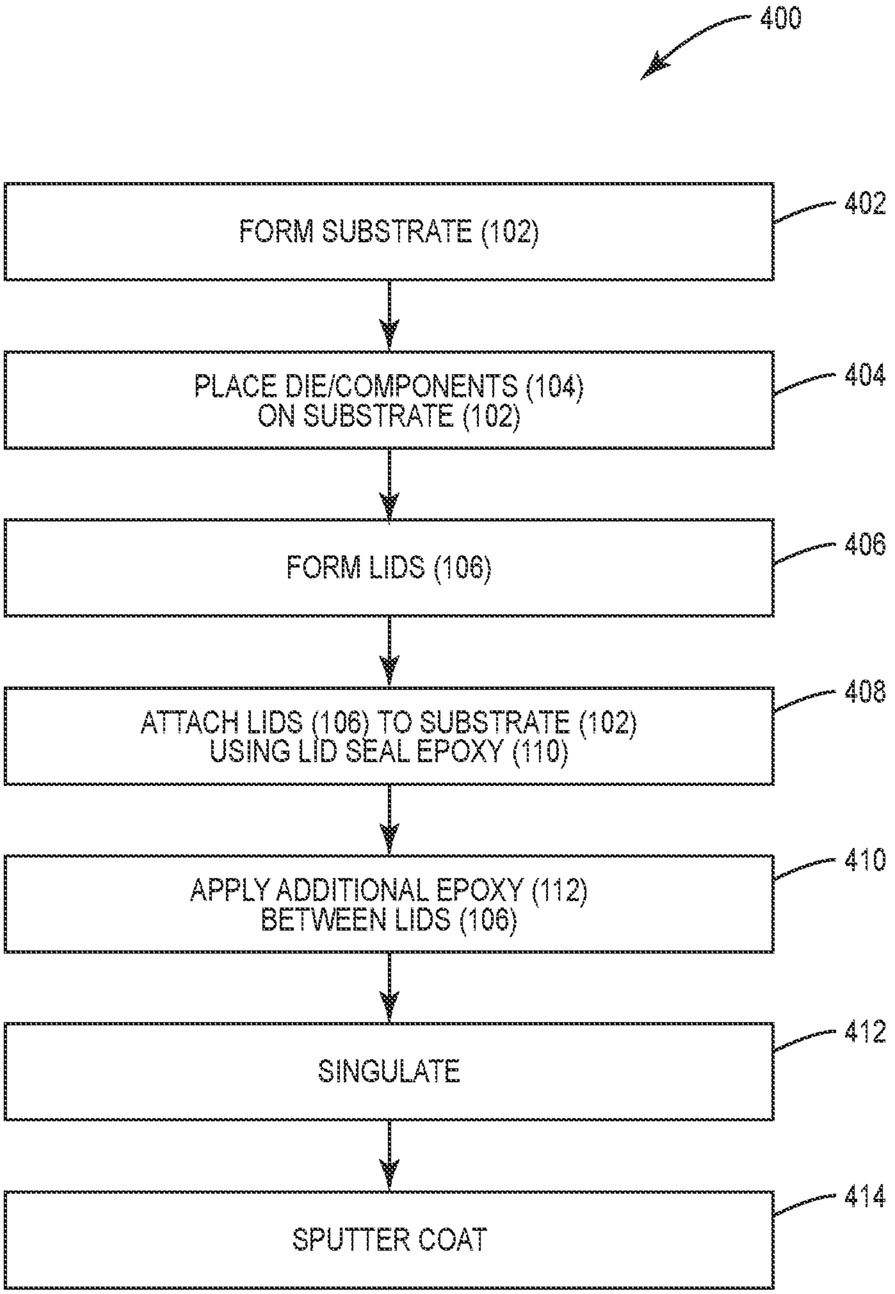
FIG. 4 is a flowchart of a process for forming the SiP of FIG. 1A.
Figure 5A:
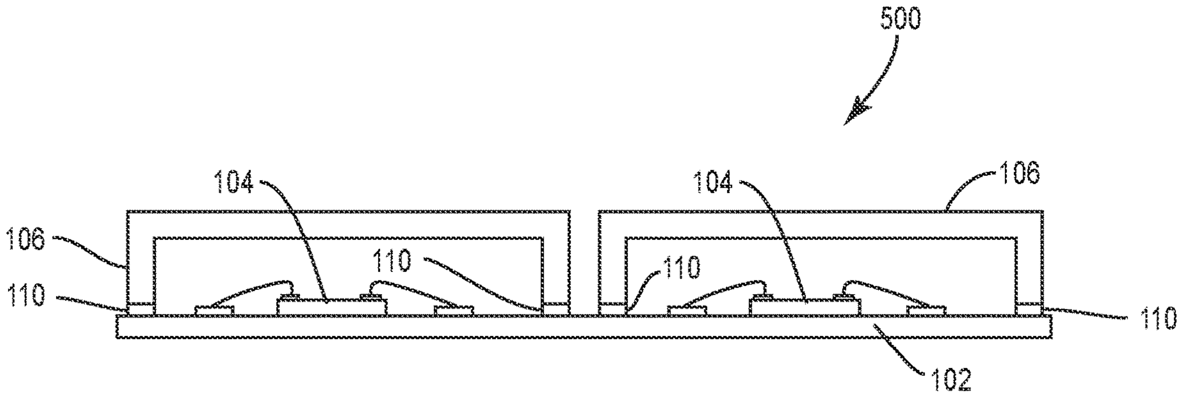
FIGS. 5A-5C illustrate cross-sectional views of the steps of the process of FIG. 4.
Figure 5B:
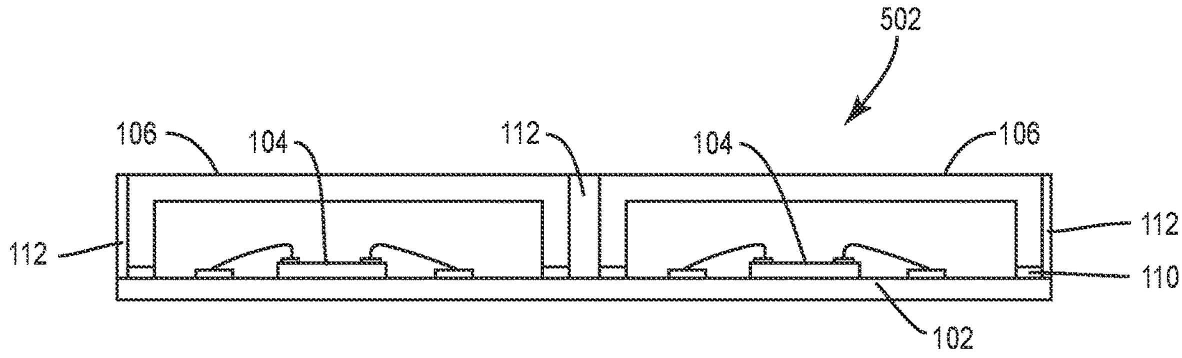
Figure 5C:
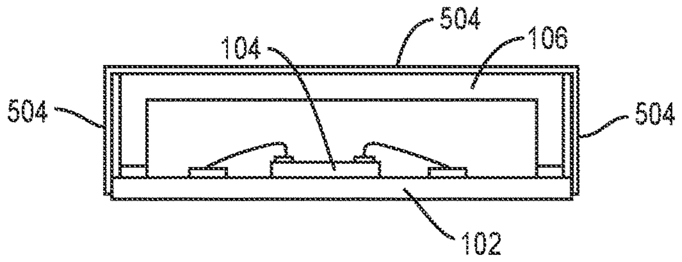

FIG. 4 illustrates a process 400 for forming the SiP 100 of FIG. 1A with additional reference to FIGS. 5A-5C. The process 400 begins by forming the substrate 102 (block 402). The substrate 102 may, as discussed above, include internal metal layers, vertical vias, and surface contacts as is well understood. The process 400 continues by placing die and components (and/or chiplets) 104 on the substrate 102 (block 404). This placement may include wirebonding, flip chip placement, ball grid array bonding, or the like.

Concurrently, lids 106 may be formed (block 406). Such lid formation may be done by grinding or routing out a desired shape in a plastic planar sheet and singulating the lids 106 therefrom after the desired cavity shapes are formed. The lids 106 are attached to the substrate 102 using a lid seal epoxy 110 (block 408, see also intermediate device 500 of FIG. 5A).

After formation of the intermediate device 500, the additional epoxy 112 may be applied between the lids 106 (block 410, see also intermediate device 502 of FIG. coating the sidewalls 114 to provide a better seal for the air cavity 108.

This application may be done using a film assisted molding technique, an epoxy fill technique, sheet molding technique, or the like. The additional epoxy 112 may bond to the lid seal epoxy 110 and help provide a stronger seal attaching the lids 106 to the substrate 102. The intermediate device 502 may be singulated into individual SiPs 100 (block 412) and a metal coating 504 may be sputtered (block 414, see also FIG. 5C) where the metal coating 504 covers the top and sides of the lid 106. The metal coating 504 may provide additional sealing function, additional rigidity, and/or provide electromagnetic shielding. The metal coating 504 may be formed from multiple layers of different metals if desired such as stainless steel (SUS)-copper (Cu)-SUS. Likewise, the thicknesses of the various layers may vary (e.g., SUS 0.1 micrometer (μm), Cu 4 μm, SUS 0.3 μm).

Figure 6:
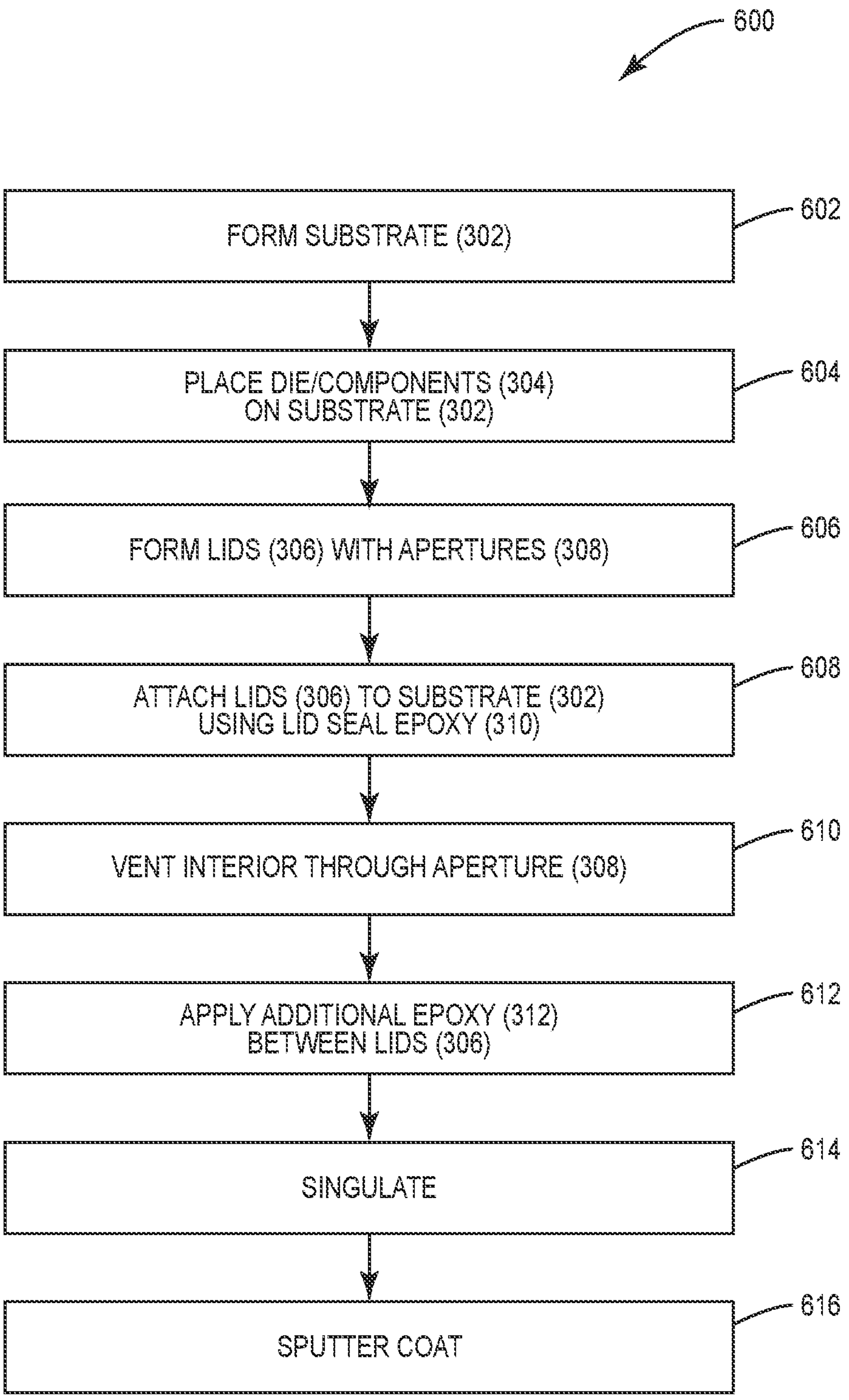
FIG. 6 is a flowchart of a process for forming the SiP of FIG. 3.
Figure 7A:
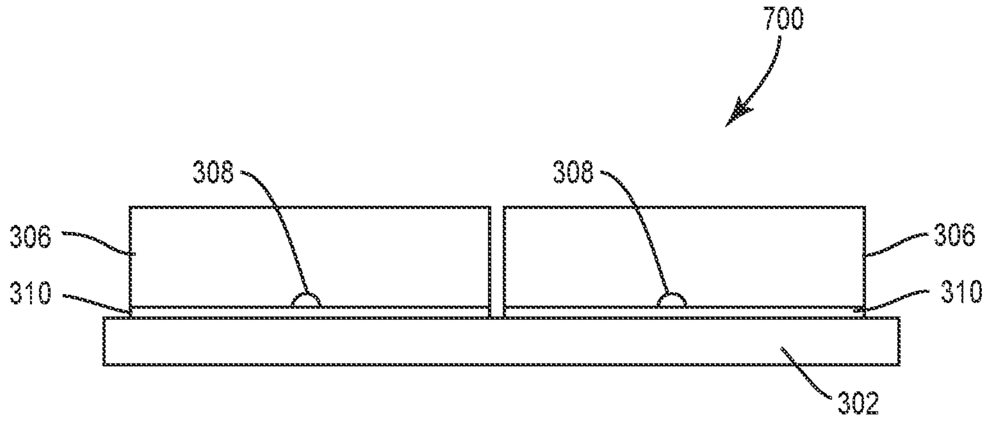
FIGS. 7A-7C illustrate cross-sectional views of the steps of the process of FIG. 6.
Figure 7B:
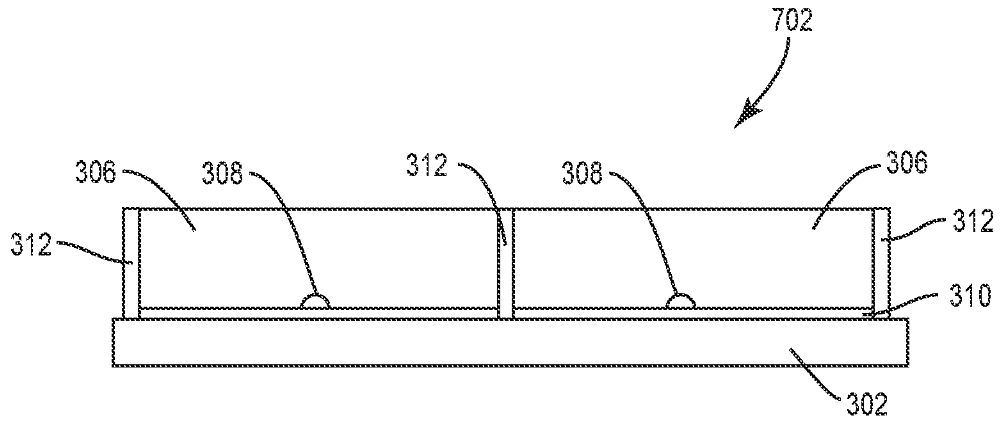
Figure 7C:
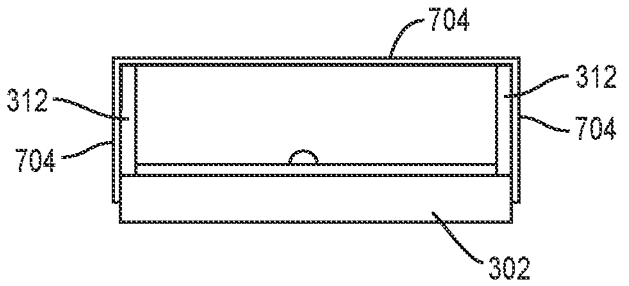

FIG. 6 illustrates a process 600 for forming the SiP 300 of FIG. 3 with additional reference to FIGS. 7A-7C. The process 600 begins by forming the substrate 302 (block 602). The substrate 302 may, as discussed above, include internal metal layers, vertical vias, and surface contacts as is well understood. The process 600 continues by placing die and components 304 (an/or chiplets) on the substrate 302 (block 604). This placement may include wirebonding, flip chip placement, ball grid array bonding, or the like.

Concurrently, lids 306 with apertures 308 may be formed (block 606). Such lid formation may be done by grinding or routing out a desired shape in a plastic planar sheet and singulating the lids 306 therefrom after the desired cavity shapes and apertures 308 are formed. The size of the aperture 308 may be determined by a bondline thickness of the lid seal epoxy 310. The lids 306 are attached to the substrate 302 using a lid seal epoxy 310 (block 608, see also intermediate device 700 of FIG. 7A). The interior space is vented through the aperture 308 (block 610).

After formation of the intermediate device 700 and venting, the additional epoxy 312 may be applied between the lids 306 (block 612, see also intermediate device 702 of FIG. 7B). The additional epoxy 312 may bond to the lid seal epoxy 310 and help provide a stronger seal attaching the lids 306 to the substrate 302. The intermediate device 702 may be singulated into individual SiPs 300 (block 614) and a metal coating 704 may be sputtered (block 616, see also FIG. 7C) where the metal coating 704 covers the top and sides of the lid 306. The metal coating 704 may provide additional sealing function, additional rigidity, and/or provide electromagnetic shielding.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. A system in a package (SiP) comprising:

a substrate comprising a first surface;

a lid comprising a generally planar element and a wall element extending generally perpendicularly from the planar element, the wall element having a lip surface generally parallel to the first surface, the lip surface coupled to the first surface with a first epoxy, and wherein the wall element comprises an exterior surface generally perpendicular to the lip surface, wherein the wall element delimits an aperture spaced from the lip surface; and a second epoxy coupled to the first epoxy and covering the exterior surface from the lip surface to the generally planar element.

2. The SiP of claim 1, further comprising a sputtered metal layer covering the second epoxy and an exposed portion of the lid.

3. The SiP of claim 2, wherein the sputtered metal layer comprises a plurality of metal layers.

4. The SiP of claim 3, wherein the plurality of metal layers comprises at least a stainless steel and a copper layer.

5. The SiP of claim 1, further comprising a die positioned on the first surface of the substrate in an air cavity formed by the lid.

6. The SiP of claim 1, further comprising a chiplet positioned on the first surface of the substrate in an air cavity formed by the lid.

7. The SiP of claim 1, wherein the second epoxy fills the aperture.

8. The SiP of claim 1, wherein the aperture is configured to act as a vent during manufacture to prevent overpressure in an air cavity formed by the lid.

9. The SiP of claim 1, further comprising a component positioned on the first surface of the substrate in an air cavity formed by the lid.

10. The SiP of claim 1, wherein the substrate comprises an FR4 material.

11. The SiP of claim 1, wherein the lid comprises an FR4 material.

12. A communication device comprising:

a communication circuit positioned in a package, the package comprising:

a substrate comprising a first surface;

a lid comprising a generally planar element and a wall element extending generally perpendicularly from the planar element, the wall element having a lip surface generally parallel to the first surface, the lip surface coupled to the first surface with a first epoxy, and wherein the wall element comprises an exterior surface generally perpendicular to the lip surface, wherein the wall element delimits an aperture spaced from the lip surface; and a second epoxy coupled to the first epoxy and covering the exterior surface from the lip surface to the generally planar element.

* * * * *